(12) United States Patent
Wang et al.

(10) Patent No.: US 9,803,831 B2
(45) Date of Patent: Oct. 31, 2017

(54) BACKLIGHT MODULE AND DISPLAY DEVICE

(71) Applicant: BOE TECHNOLOGY GROUP CO., LTD., Beijing (CN)

(72) Inventors: Shang Wang, Beijing (CN); Qiuxiang Li, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 505 days.

(21) Appl. No.: 14/498,680

(22) Filed: Sep. 26, 2014

(65) Prior Publication Data

US 2015/0338065 A1 Nov. 26, 2015

(30) Foreign Application Priority Data

May 20, 2014 (CN) .......................... 2014 1 0214790

(51) Int. Cl.
*F21V 9/16* (2006.01)
*F21V 29/70* (2015.01)
(Continued)

(52) U.S. Cl.
CPC .................. *F21V 9/16* (2013.01); *F21V 7/22* (2013.01); *F21V 29/70* (2015.01);
(Continued)

(58) Field of Classification Search
CPC ... F21V 9/16; F21V 29/70; F21V 7/22; H01L 33/507; G02F 1/133603; G02F 1/133609; G02F 1/133617
See application file for complete search history.

(56) References Cited

U.S. PATENT DOCUMENTS

2006/0262397 A1 11/2006 Lee et al.
2010/0182536 A1 7/2010 Karakawa
(Continued)

FOREIGN PATENT DOCUMENTS

CN 101701692 A 5/2010
CN 102043286 A 5/2011
(Continued)

OTHER PUBLICATIONS

Office Action in Chinese Patent Application No. 201410214790.3, dated Oct. 10, 2015.
(Continued)

*Primary Examiner* — Thomas M Sember
(74) *Attorney, Agent, or Firm* — Brooks Kushman P.C.

(57) ABSTRACT

The present invention provides a backlight module and a display device. The backlight module includes a back plate; a light-emitting chip formed on the back plate and capable of emitting light rays of a first color; a packaging entity made of a light-transmitting material and configured to package the light-emitting chip onto the back plate; and a phosphor layer formed in the packaging entity and consisting of phosphors doped in the packaging entity. The phosphor layer is configured to convert a part of light rays among the light rays of the first color emitted from the light-emitting chip into light rays of a second color, so as to be mixed with the remaining, unconverted light rays of the first color to form white backlight.

20 Claims, 2 Drawing Sheets

(51) Int. Cl.

| | | |
|---|---|---|
| *F21V 7/22* | (2006.01) | |
| *H01L 33/50* | (2010.01) | |
| *G02F 1/1335* | (2006.01) | |
| *H01L 33/52* | (2010.01) | |
| *H01L 25/075* | (2006.01) | |
| *F21Y 105/10* | (2016.01) | |
| *F21Y 115/10* | (2016.01) | |

(52) U.S. Cl.
CPC .. *G02F 1/133603* (2013.01); *G02F 1/133609* (2013.01); *G02F 1/133617* (2013.01); *H01L 33/507* (2013.01); *F21Y 2105/10* (2016.08); *F21Y 2115/10* (2016.08); *G02F 2001/133607* (2013.01); *H01L 25/0753* (2013.01); *H01L 33/52* (2013.01); *H01L 2924/0002* (2013.01)

(56) References Cited

U.S. PATENT DOCUMENTS

2011/0141716 A1\* 6/2011 Wiesmann ........ G02F 1/133603
362/97.1
2012/0033404 A1 2/2012 Wu et al.
2012/0256198 A1 10/2012 Huang et al.
2015/0124456 A1\* 5/2015 Hikmet .................... F21V 3/04
362/293

FOREIGN PATENT DOCUMENTS

| CN | 102798060 A | 11/2012 |
|---|---|---|
| CN | 103066189 A1 | 4/2013 |
| CN | 103700756 A | 4/2014 |
| KR | 10-2006-0076520 A | 7/2006 |

OTHER PUBLICATIONS

Chinese Patent Application No. 201410214790.3: Notification of the Second Office Action dated Apr. 27, 2016, 8 pages.
Office Action in Chinese Patent Application No. 201410214790.3, dated Sep. 12, 2016.
Fourth Office Action for Chinese Application No. 201410214790.3, dated Feb. 28, 2017, 9 Pages.

\* cited by examiner

BACKLIGHT MODULE AND DISPLAY DEVICE

CROSS REFERENCE OF RELATED APPLICATIONS

The present application is based on and claims the benefit of priority of Chinese Patent Application No. 201410214790.3 filed on May 20, 2014, the entire contents of which are hereby incorporated by reference.

FIELD OF THE INVENTION

The present invention relates to the field of display technology, in particular to a backlight module and a display device.

DESCRIPTION OF THE PRIOR ART

An existing direct-type backlight module includes a white LED, a scattering layer, a prism structure, and so on. The light from the white LED is scattered by the scattering layer and converged by the prism structure, and then enters a liquid crystal panel, so as to provide the liquid crystal panel with the white backlight.

Along with the development of technologies, there are many methods for manufacturing the white LED. For example, the white light may be generated by mixing the light from red, green light and blue LED chips, or by activating red, green and blue phosphors by a UV LED chip. Currently, the most popular way for packaging the white LED is to coat a fluorophor containing yellow phosphors outside the blue LED chip, thereby to activate the yellow phosphors with the blue light. To be specific, the blue LED chip is arranged within a bowl, and the fluorophor containing the yellow phosphors is coated onto the bowl so as to package the blue LED chip, As a result, a part of the blue light from the blue LED chip activates the yellow phosphors to generate the yellow light, which is then mixed with the blue light to generate the white light.

However, the existing direct-type backlight module has the following disadvantages.

The fluorophor is coated onto the bowl, so there will be an optical interface between the blue LED chip and the fluorophor, which will result in low luminous efficiency of the white LED. Moreover, an optical interface between the white LED and the scattering layer or the prism structure will also result in a low light utilization ratio of the entire backlight module.

In addition, the scattering layer and the prism structure are arranged at a light-emitting side of the white LED separately, and the light transmitting from the white LED passes through different optical media, such as air between the LED chip and a phosphor layer, air between the white LED and the scattering layer, a transparent film of the scattering layer, air between the scattering layer and the prism structure, and a transparent film of the prism structure, etc., and a resultant optical path is relatively long. As a result, when the blue light transmitting from a light source and the yellow light converted by the phosphor pass through a light guide plate and the films, such phenomena as uneven color at a light-exiting surface and an overall color offset will be caused due to the differences on the optical dispersion and absorption of the light of different colors.

SUMMARY OF THE INVENTION

An object of the present invention is to provide a backlight module and a display device, so as to effectively remove optical interfaces, thereby to improve a light utilization ratio of the entire backlight module and prevent a color offset due to the optical dispersion of membranes.

In one aspect, the present invention provides a backlight module, including:

a back plate;

a light-emitting chip formed on the back plate and capable of emitting light rays of a first color;

a packaging entity made of a light-transmitting material and configured to package the light-emitting chip onto the back plate; and a phosphor layer formed in the packaging entity and consisting of phosphors doped in the packaging entity, the phosphor layer being configured to convert a part of light rays among the light rays of the first color emitted from the light-emitting chip into light rays of a second color, so as to be mixed with the remaining, unconverted light rays of the first color to form white backlight.

Wherein, solvent consisting the phosphor layer is of a material the same as the packaging entity.

Further, the backlight module further includes:

a scattering layer configured to scatter the light rays emitted through the phosphor layer, the scattering layer being formed by scattering particles doped in the packaging entity and arranged at a side of the phosphor layer away from the light-emitting chip.

Further, the backlight module further includes:

a prism structure configured to converge the light rays emitted from a light-exiting surface of the packaging entity and arranged on the light-exiting surface of the packaging entity.

Further, the backlight module includes:

a reflective layer arranged on the back plate and at a side of the light-emitting chip away from the phosphor layer.

Further, the packaging entity is made of silica gel or glass.

Further, the light-emitting chip is a blue light chip, and the phosphor is a yellow phosphor.

Further, the light-emitting chip includes a plurality of LED chips arranged in an array form.

The phosphor layer is divided into a plurality of phosphor unit regions arranged in an array form, each of the phosphor unit regions corresponds to the respective light-emitting chip and includes a middle portion facing the LED chip and an edge portion located at an edge of the middle portion.

Wherein, the phosphor unit region is of a curved-surface layer structure with its middle portion protruding toward a side away from the light-emitting chip;

and/or the phosphor unit region has a thickness gradually decreased from the middle portion to the edge portion;

and/or the phosphors in the phosphor unit region have a density gradually decreased from the middle portion to the edge portion.

In the case that the phosphor unit region has a thickness gradually decreased from the middle portion to the edge portion, the phosphor layer is formed by providing surface depressions at a surface of the packaging entity and injecting the phosphors into the surface depressions.

In the case that the phosphors in the phosphor unit region have a density gradually decreased from the middle portion to the edge portion, the phosphor layer is formed by a secondary dispersing step of dispersing phosphors with a high concentration into the phosphor layer with an even concentration.

Further, the backlight module includes:

a plurality of reflective walls arranged at both sides of the respective light-emitting chip in an array form and configured to reflect the light rays emitted from the light-emitting chip so as to converge the divergent light rays from the light-emitting chip.

Further, the backlight module includes:

a heat sink arranged on the back plate.

In another aspect, the present invention provides a display device including a display panel and the above-mentioned backlight module.

The present invention has the following advantages. According to the backlight module of the present invention, it is able to achieve an effective coupling between the light-emitting chip and the films. In addition, the packaging entity is filled into a coupling structure and the phosphor layer is arranged above the light-emitting chip, so it is able to effectively remove the optical interfaces and improve the luminous efficiency of the light-emitting chip, thereby to improve the light utilization ratio of the entire backlight module and prevent the color offset due to the optical dispersion of the film materials.

DETAILED DESCRIPTION OF THE PREFERRED EMBODIMENTS

Figure 1:
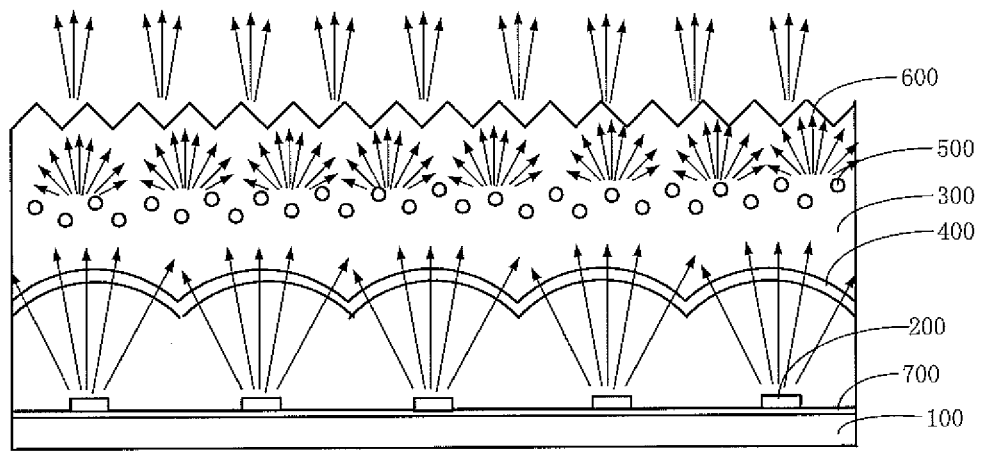
FIG. 1 is a schematic view showing a backlight module according to the first embodiment of the present invention.

The principles and features of the present invention will be described hereinafter in conjunction with the drawings. The following embodiments are for illustrative purposes only, but are not used to limit the scope of the present invention.

In order to prevent a low light utilization ratio and a color offset of an existing backlight module due to optical interfaces between an LED chip and films, the present invention provides a backlight module, so as to effectively remove the optical interfaces, thereby to improve the light utilization ratio of the entire backlight module and prevent the color offset due to the optical dispersion of the membranes.

As shown in FIGS. 1-4, the backlight module of the present invention includes:

a back plate 100;

a light-emitting chip 200 formed on the back plate 100 and capable of emitting light rays of a first color;

a packaging entity 200 made of a light-transmitting material and configured to package the light-emitting chip 200 onto the back plate; and a phosphor layer 400 formed in the packaging entity 300 and consisting of phosphors doped in the packaging entity 300. The phosphor layer 400 is configured to convert a part of light rays among the light rays of the first color emitted from the light-emitting chip 200 into light rays of a second color, so as to the light rays of the second color to be mixed with the remaining, unconverted light rays of the first color to form a white backlight.

The light-emitting chip 200 is packaged onto the back plate 100 by means of the packaging entity 300, and inside the packaging entity 300, it is doped with the phosphors. A part of the light rays among the light rays of the first color emitted from the light-emitting chip 200 will activate the phosphors to generate the light rays of the second color. The generated light rays of the second color will be mixed with the remaining light rays of the first color to form the white backlight. Because the light-emitting chip 200 is packaged onto the back plate 100 by means of the packaging entity 300 and the phosphors are doped in the packaging entity 300, i.e., there are no optical interface between the light-emitting chip 200 and the packaging entity 300 and between the phosphors and the packaging entity 300. As compared with the prior art where the light-emitting chip 200 is arranged in a bowl and the phosphors are coated onto the bowl, the backlight module of the present invention is able to effectively remove the optical interfaces, thereby to reduce a light loss due to the optical interfaces, and improve the luminous efficiency of the light-emitting chip 200 and the light utilization ratio of the entire backlight module. In addition, the light rays emitted from the light-emitting chip 200 travel within the packaging entity 300 and a resultant optical path is relatively short, so it is able to reduce the occurrence of the color offset.

At first, a first part of the packaging entity 300 may be formed on the light-emitting chip 200 by injection molding or any other process, and a solution doped with the phosphors may be directly coated onto a surface of the first part of the packaging entity 300 to form the phosphor layer 400. A solvent of the solution is consisted a material the same as that of the packaging entity 300, so there is no optical interface between the phosphor layer 400 and the packaging entity 300 (which is normally a silica gel layer formed by silica gel material). Then, the entire packaging entity 300 is formed on the phosphor layer 400 by injection molding or any other process. It should be appreciated that, the phosphor layer 400 can also be formed by directly spraying the phosphors onto the surface of the first part of the packaging entity 300, or by covering an existing phosphor layer 400 onto the surface of the first part of the packaging entity 300. Of course, the phosphor layer 400 may also be doped in the packaging entity 300 in any other ways, which will not be listed herein.

Preferably, as shown in FIGS. 1-4, the backlight module further includes:

a scattering layer 500 configured to scatter the light rays emitted from the phosphor layer 400. The scattering layer 500 is formed by scattering particles doped in the packaging entity 300 and arranged at a side of the phosphor layer 400 away from the light-emitting chip 200.

In the above solution, the scattering layer 500 is formed by doping the scattering particles in the packaging entity 300. The scattering particles are crystalline powders with a high purity, and substantially absorb no light rays but scatter the light energy. Hence, the scattering layer 500 can effectively scatter the light rays emitted from the phosphors, i.e., the white light rays emitted from the phosphor layer 400 can be effectively mixed to provide evener light than that emitted from the phosphor layer 400, thereby to form the even, white backlight. Moreover, because the scattering particles are doped in the packaging entity 300, i.e., there is no optical interface between the phosphor layer 400 and the scattering layer 500. As compared with the prior art where the scattering layer 500 is arranged at one side of the white LED separately, the backlight module of the present invention is able to effectively remove the optical interfaces, thereby to reduce a light loss due to the optical interfaces, improve the light utilization ratio of the entire backlight module, and prevent the color offset due to the optical dispersion generated by the phosphor layer 400 and the scattering layer 500.

At first, the first part of the packaging entity 300 may be formed on the light-emitting chip 200 by injection molding or any other process, and the solution doped with the phosphors may be directly coated onto the surface of the first part of the packaging entity 300 to form the phosphor layer 400. The solvent of the solution is made of a material the same as that of the packaging entity, so there is no optical interface between the phosphor layer 400 and the silica gel layer. Then, a second part of the packaging entity 300 is formed on the phosphor layer 400 by injection molding or any other process, and the scattering particles are coated or sprayed onto an upper surface of the second part of the packaging entity 300, so as to form the scattering layer 500. Of course, the scattering layer 500 may also be doped in the packaging entity 300 in any other ways, which will not be listed herein.

Preferably, as shown in FIGS. 1-4, the backlight module of the present embodiment further includes:

a prism structure 600 configured to converge the light rays emitted from a light-exiting surface of the packaging entity 300 and arranged on the light-exiting surface of the packaging entity 300.

In the above solution, by arranging the prism structure 600 at the light-exiting surface of the packaging entity 300, it is able to effectively converge the light rays emitted from the scattering layer 500, thereby to provide a main-viewing-angle luminous effect. Meanwhile, the prism structure 600 may be used to effectively destroy the total internal reflection at the surface of the packaging entity 300, and thereby the luminous efficiency will be improved.

At first, the first part of the packaging entity 300 may be formed on the light-emitting chip 200 by injection molding or any other process, and the solution doped with the phosphors may be directly coated onto the surface of the first part of the packaging entity 300 to form the phosphor layer 400. The solvent of the solution is consisted of a material the same as that of the packaging entity, so there is no optical interface between the phosphor layer 400 and the silica gel layer. Then, the second part of the packaging entity 300 is formed on the phosphor layer 400 by injection molding or any other process, and the scattering particles are coated or sprayed onto the upper surface of the second part of the packaging entity 300, so as to form the scattering layer 500. And then, a third part of the packaging entity 300 is formed on the scattering layer 500 by injection molding, hot-rolling, or by directly attaching an existing prism layer so as to the prism structure 600 is formed on an upper surface of the third part of the packaging entity 300. Of course, the prism structure 600 may also be formed in any other ways, which will not be listed herein.

Preferably, as shown in FIGS. 1-4, the backlight module further includes:

a reflective layer 700 arranged on the back plate 100 and at a side of the light-emitting chip 200 away from the phosphor layer 400.

By providing the reflective layer 700, it is able to reuse the light rays reflected by the phosphor layer 400 and/or the scattering layer 500 and/or the prism structure 600 to form the backlight, so it is able to improve the light utilization ratio.

In addition, silica gel has excellent optical properties, and can be machined conveniently due to its stable physical properties. Hence, the packaging entity 300 is preferably made of silica gel. Of course, the packaging entity 300 may also be made of any other materials, such as glass, etc.

Preferably, the light-emitting chip 200 may be a blue light chip which serves as a light source for activating the phosphors. Correspondingly, yellow phosphors may be used as the phosphors. Of course, the colors of the light-emitting chip 200 and the phosphors are not limited to the above, and the other color combinations may also be used. For example, the light-emitting chip 200 may be the blue light chip, and the phosphors may be a mixture of red phosphors and green phosphors at a certain ratio. These color combinations will not be listed herein.

Preferably, the light-emitting chip 200 is a point light source, which is a blue LED chip, and a plurality of the blue LED chips are arranged in an array form. The backlight module further includes:

a plurality of reflective walls 800 arranged at both sides of the respective light-emitting chip 200 in an array form and configured to reflect the light rays emitted from the light-emitting chip 200 so as to converge the divergent light rays emitted from the light-emitting chip 200.

In the above solution, by arranging the reflective walls 800 between the light-emitting chips 200, it is able to reflect ahead the light rays emitted from the light-emitting chip 200 at a large angle right, so as to provide forward illumination. In addition, an emergent angle of the light rays emitted from the light-emitting chip 200 is reduced, so the light rays reaching a side wall of the packaging entity 300 will be reduced too. As a result, it is able to reduce the light loss of the backlight module and improve the light utilization ratio.

Preferably, the backlight module further includes a heat sink (not shown) arranged on the back plate 100. Through the heat sink, it is able to dissipate the heat generated by the light-emitting chip 200.

In addition, the blue LED chip emits light in a Lambertian form where the light rays at zero degree, positive direction have the strongest energy and the energy will decrease as the angle increases. Hence, in term of the angular field, as compared with the white light in a direction close to the zero degree, positive direction, the white light in a direction closer to a horizontal direction will have more problems on insufficient blue light. Correspondingly, the light intensity of the light at zero degree, positive direction which is emitted from the LED chip is higher than that of the light rays emitted at the other angles, so the white light at zero degree, positive direction will have superfluous blue light.

In other words, when the phosphor layer 400 approaches the light source, an overlapping region adjacent to the light-emitting chip 200 is gradually reduced, so the main energy of the light source is concentrated on a position of the phosphor layer 400 right above the light-emitting chip 200. In order to enable the light emitted by the phosphor layer 400 is white light, the following preferred embodiments are provided.

First Embodiment

FIG. 1 is a schematic view showing the backlight module according to the first embodiment of the present invention.

As shown in FIG. 1, in the backlight module of the first embodiment, the light-emitting chip 200 includes a plurality of LED chips arranged in an array form. The phosphor layer 400 is divided into a plurality of phosphor unit regions arranged in an array form, each of the phosphor unit regions corresponds to the respective light-emitting chip 200 and includes a middle portion facing the LED chip and an edge portion located at an edge of the middle portion. Wherein, each phosphor unit region is of a curved-surface layer structure with its middle portion protruding toward a side away from the light-emitting chip 200.

In this embodiment, by designing the phosphor layer 400 as a curved-surface layer structure, it is able to evenly transmit the light in a Lambert type emitted from the LED chip toward a surface of the phosphor, thereby to provide white-light illumination at a large area and prevent the occurrence of uneven backlight color.

In this embodiment, when manufacturing the first part of the packaging entity 300 on the light-emitting chip 200, the surface of the first part of the packaging entity 300 may be formed as a curved one by injection molding, then the phosphors may be coated or directly sprayed onto the curved surface to form the phosphor layer 400 with the curved-surface layer structure, and then the other films may be formed on the phosphor layer 400.

Second Embodiment

Figure 2:
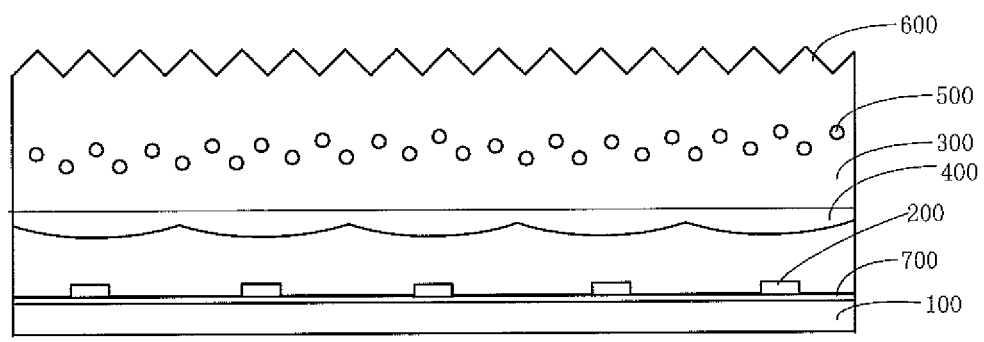
FIG. 2 is a schematic view showing the backlight module according to the second embodiment of the present invention.

FIG. 2 is a schematic view showing the backlight module according to the second embodiment of the present invention.

As shown in FIG. 2, the backlight module in this embodiment differs from that in the first embodiment in that each of the phosphor unit regions has a thickness gradually decreased from the middle portion to the edge portion.

In this embodiment, when the phosphor layer 400 approaches the light-emitting chip 200, the overlapping region adjacent to the light-emitting chip 200 is gradually reduced, so the light rays from the light-emitting chip 200 are mainly concentrated on a position of the phosphor layer 400 right above the light-emitting chip 200. In order to enable the phosphor layer 400 to provide the white light, the phosphor layer 400 close to the position right above the light-emitting chip 200 will be thickened, while the phosphor layer 400 at a region between the light-emitting chips 200 will be thinned, so as to enable the transmission light being white light.

As compared with the phosphor layer 400 with a curved surface used in the first embodiment, the phosphor layer 400 with variations in thickness used in the present embodiment will be thinner. As a result, it is able to effectively reduce the thickness of the films and manufacture the phosphor layer more conveniently.

In this embodiment, when the first part of the packaging entity 300 is formed on the light-emitting chip 200, surface depressions structure may be formed on the surface of the first part of the packaging entity 300 by injection molding, then the phosphors are injected into the surface depressions so that the phosphors automatically spread out to form a layer structure with uneven thickness, and then the other films can be formed on the phosphor layer 400 subsequentially.

Third Embodiment

Figure 3:
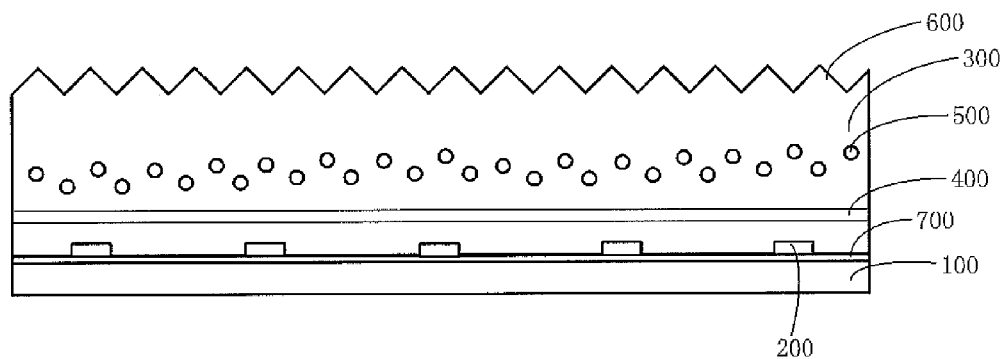
FIG. 3 is a schematic view showing the backlight module according to the third embodiment of the present invention.
Figure 4:
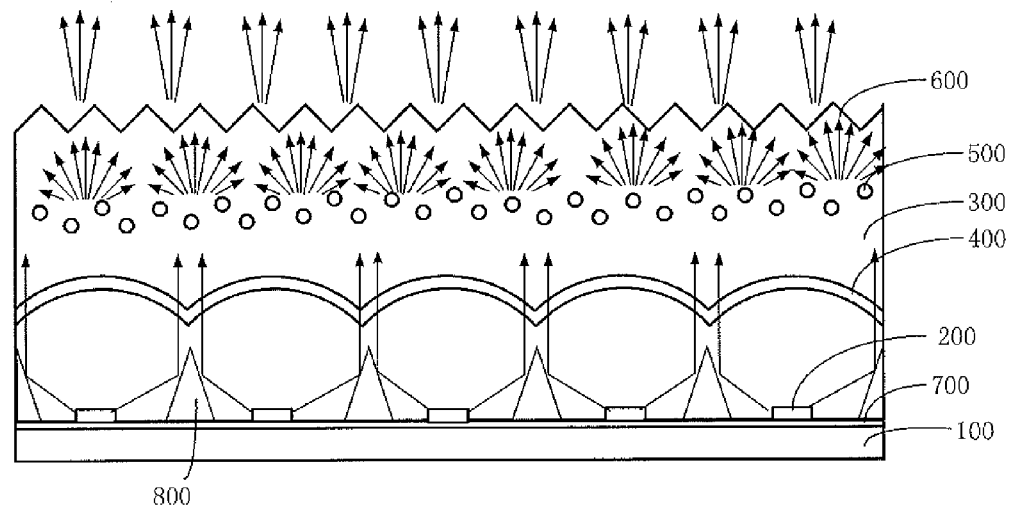
FIG. 4 is a schematic view showing the backlight module according to the fourth embodiment of the present invention.

FIG. 3 is a schematic view showing the backlight module according to the third embodiment of the present invention.

As shown in FIG. 3, the backlight module in this embodiment differs from that in the first embodiment in that the phosphors in each phosphor unit region have a density gradually decreased from the middle portion to the edge portion.

In this embodiment, when the phosphor layer 400 approaches the light-emitting chip 200, the overlapping region adjacent to the light-emitting chip 200 is gradually reduced, so the light rays emitted from the light-emitting chip 200 are mainly concentrated on a position of the phosphor layer 400 right above the light-emitting chip 200. In order to enable the phosphor layer 400 to provide the white light, the phosphor layer 400 close to the position right above the light-emitting chip 200 will have a density greater than that of the phosphor layer 400 at a region between the light-emitting chips 200, so as to enable the transmission light being whit light.

As compared with the phosphor layer 400 with the curved surface used in the first embodiment and the phosphor layer 400 with uneven thickness used in the second embodiment, the phosphor layer 400 in this embodiment may be much thinner and arranged much closer to the light-emitting chip 200. As a result, it is able to further reduce the thickness of the films.

In this embodiment, when the first part of the packaging entity 300 is formed on the light-emitting entity 200, the phosphor layer 400 may be formed on the surface of the first part of the packaging entity 300 by secondary dispersing, i.e., dispersing the phosphors with a high concentration into the phosphor layer 400 with an even concentration, which had been formed originally, so as to obtain a change in the concentration gradients by means of the diffusion thereof. Then, the other films can be formed on the phosphor layer 400.

It should be appreciated that, in the other embodiments of the present invention, the phosphor layer 400 may also have a structure obtained by combining those in the above-mentioned embodiments. For example, the phosphor unit region may have a curved-surface layer structure and have a thickness gradually decreased from the middle portion to the edge portion, so as to provide even light in a better manner. These combinations will not be listed herein.

In addition, the present invention further provides a display device including a display panel and the above-mentioned backlight module.

The above are merely the preferred embodiments of the present invention. It should be appreciated that, a person skilled in the art may make further improvements and modifications without departing from the principle of the present invention, and these improvements and modifications shall also be included in the scope of the present invention.

What is claimed is:
1. A backlight module, comprising:
a back plate;
a light-emitting chip formed on the back plate and capable of emitting light rays of a first color;
a packaging entity made of a light-transmitting material and configured to package the light-emitting chip onto the back plate; and
a phosphor layer formed in the packaging entity and consisting of phosphors doped in the packaging entity, the phosphor layer being configured to convert a part of light rays among the light rays of the first color emitted from the light-emitting chip into light rays of a second color, so as to be mixed with the remaining, unconverted light rays of the first color to form a white backlight;
wherein the phosphor layer is divided into a plurality of phosphor unit regions corresponding to the light-emitting chip, and each of the plurality of phosphor unit regions comprises a middle portion and an edge portion located at an edge of the middle portion, wherein,
the phosphor unit region is of a curved-surface layer structure with its middle portion protruding toward a side away from the light-emitting chip, and/or
the phosphor unit region has a thickness gradually decreased from the middle portion to the edge portion, and/or the phosphors in the phosphor unit region have a density gradually decreased from the middle portion to the edge portion.

2. The backlight module according to claim 1, wherein solvent consisting the phosphor layer is of a material the same as the packaging entity.

3. The backlight module according to claim 1, further comprising:
a scattering layer configured to scatter the light rays emitted through the phosphor layer, the scattering layer being formed by scattering particles doped in the packaging entity and arranged at a side of the phosphor layer away from the light-emitting chip.

4. The backlight module according to claim 1, further comprising:
a prism structure configured to converge the light rays emitted from a light-exiting surface of the packaging entity and arranged on the light-exiting surface of the packaging entity.

5. The backlight module according to claim 1, further comprising:
a reflective layer arranged on the back plate and at a side of the light-emitting chip away from the phosphor layer.

6. The backlight module according to claim 1, wherein the packaging entity is made of silica gel or glass.

7. The backlight module according to claim 1, wherein the light-emitting chip is a blue light chip, and the phosphor is a yellow phosphor.

8. The backlight module according to claim 1, wherein in the case that the phosphor unit region has a thickness gradually decreased from middle portion to the edge portion, the phosphor layer is formed by providing surface depressions at a surface of the packaging entity and injecting the phosphors into the surface depressions.

9. The backlight module according to claim 1, wherein in the case that the phosphors in the phosphor unit region have a density gradually decreased from the middle portion to the edge portion, the phosphor layer is formed by a secondary dispersing step of dispersing phosphors with a high concentration into the phosphor layer with an even concentration.

10. The backlight module according to claim 1, further comprising:
a plurality of reflective walls arranged at both sides of the light-emitting chip in an array form and configured to reflect the light rays emitted from the light-emitting chip so as to converge the divergent light rays from the light-emitting chip.

11. The backlight module according to claim 1, further comprising:
a heat sink arranged on the back plate.

12. A display device, comprising a display panel and the backlight module according to claim 1.

13. The display device according to claim 12, wherein a solvent consisting a phosphor layer is made of a material the same as a packaging entity.

14. The display device according to claim 12, wherein the backlight module further comprises:
a scattering layer configured to scatter light rays emitter from the phosphor layer, the scattering layer being formed by scattering particles doped in the packaging entity and arranged at a side of the phosphor layer away from a light-emitting chip.

15. The display device according to claim 12, wherein the backlight module further comprises:
a prism structure configured to converge the light rays emitted from a light-exiting surface of the packaging entity and arranged on the light-exiting surface of the packaging entity.

16. The backlight module according to claim 12, wherein the backlight module further comprises:
a reflective layer arranged on a back plate and at a side of the light-emitting chip away from the phosphor layer.

17. The display device according to claim 12, wherein the light-emitting chip is a blue light chip, and the phosphor is a yellow phosphor.

18. The backlight module according to claim 1, wherein the light-emitting chip comprises a plurality of LED chips arranged in an array form;
the plurality of phosphor unit regions is arranged in an array form and in a one-to-one correspondence with the plurality of LED chips; and
each of the phosphor unit regions comprises the middle portion facing its corresponding LED chip.

19. A backlight module, comprising:
a back plate;
a light-emitting chip formed on the back plate and capable of emitting light rays of a first color;
a packaging entity made of a light-transmitting material and configured to package the light-emitting chip onto the back plate;
a phosphor layer formed in the packaging entity and consisting of phosphors doped in the packaging entity, the phosphor layer being configured to convert a part of light rays among the light rays of the first color emitted from the light-emitting chip into light rays of a second color, so as to be mixed with the remaining, unconverted light rays of the first color to form a white backlight; and
a plurality of reflective walls arranged at both sides of the light-emitting chip in an array form and configured to reflect the light rays emitted from the light-emitting chip so as to converge the divergent light rays from the light-emitting chip.

20. A display device, comprising a display panel and the backlight module according to claim 19.

* * * * *